United States Patent
Ikeda et al.

(10) Patent No.: US 6,256,201 B1
(45) Date of Patent: Jul. 3, 2001

(54) PLATE TYPE HEAT PIPE METHOD OF MANUFACTURING SAME AND COOLING APPARATUS USING PLATE TYPE HEAT PIPE

(75) Inventors: Masami Ikeda; Masaaki Yamamoto; Tatsuhiko Ueki; Ken Sasaki, all of Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/422,393

(22) Filed: Oct. 21, 1999

(30) Foreign Application Priority Data

Oct. 21, 1998 (JP) .................................................. 10-300198

(51) Int. Cl.[7] ............................... F28D 15/00; H05K 7/20
(52) U.S. Cl. .......................... 361/704; 361/677; 361/699; 361/689; 361/703; 165/104.26; 165/104.33
(58) Field of Search ..................................... 361/676, 677, 361/689, 698, 699, 702, 711, 717, 703–718; 165/80.3–80.4, 104.21, 104.26, 104.33; 257/715, 720

(56) References Cited

U.S. PATENT DOCUMENTS

| | | | |
|---|---|---|---|
| 3,613,778 | * 10/1971 | Feldman et al. | 165/105 |
| 3,680,189 | * 8/1972 | Noren | 29/157.3 R |
| 4,046,190 | * 9/1977 | Marcus et al. | 165/105 |
| 4,047,198 | * 9/1977 | Sekhon et al. | 357/82 |
| 4,674,565 | * 6/1987 | Beam | 165/104.26 |
| 4,697,205 | * 9/1987 | Eastman | 357/82 |
| 5,309,986 | * 5/1994 | Itoh | 165/104.26 |
| 5,694,295 | * 12/1997 | Mochizuki et al. | 361/699 |
| 5,761,037 | * 6/1998 | Anderson et al. | 361/700 |
| 5,769,154 | * 6/1998 | Adkins et al. | 165/104.26 |
| 6,082,443 | * 7/2000 | Yamamoto et al. | 165/104.26 |

FOREIGN PATENT DOCUMENTS 3-247994 * 11/1991 (JP) ...................................... 505/890

OTHER PUBLICATIONS

IBM Technical Disclosure Bulletin, No: NN72,022,769. Feb. 1972.*

* cited by examiner

Primary Examiner—Leo P. Picard
Assistant Examiner—Anatoly Vortman
(74) Attorney, Agent, or Firm—Cantor Colburn LLP

(57) ABSTRACT

A plate type heat pipe comprises: a plate type container which includes a heat absorbing side and a heat dissipating side to form a hermetically sealed hollow portion; at least one heat transfer block which is thermally connected to each of inner walls of the heat absorbing side and the heat dissipating side; a wick which is placed along a side wall of the heat transfer block through the inner wall of the heat dissipating side; and a working fluid enclosed in the hollow portion. A securing member to secure the wick and the heat transfer block in close contact may be further included.

15 Claims, 1 Drawing Sheet

PLATE TYPE HEAT PIPE METHOD OF MANUFACTURING SAME AND COOLING APPARATUS USING PLATE TYPE HEAT PIPE

FIELD OF THE INVENTION

The present invention relates to a plate type heat pipe appropriately used to cool electric or electronic parts such as semiconductor chips.

BACKGROUND OF THE INVENTION

Electric or electronic parts such as semiconductor chips mounted on various equipment such as personal computers or power equipment generate heat in some extent when used. When the electric or electronic parts are excessively heated by the generated heat, the performance thereof is lowered, or the lifetime thereof is shortened. Furthermore, since the size of the electric devices represented by the personal computer or the like becomes smaller, it becomes an urgent task to develop an excellent cooling techniques to cool the small-sized electric or electronic parts mounted on the personal computer or the like.

There is provided an air cooling type cooling method as one of the method of cooling electric or electronic elements which is to be cooled (hereinafter referred to as the "part to be cooled"). More specifically, in the air cooling type cooling method, a fan or the like is installed in the box to accommodate the electric devices on which the parts to be cooled are mounted, and the inside of the box is cooled by the fan or the like so as to prevent the temperature of the parts to be cooled from being excessively risen. The above-mentioned cooling method is particularly effective to cool the relatively large-sized electric devices. However, the above-mentioned cooling method is not appropriate to cool the small-sized electric devices.

In addition to the above-mentioned air cooling type cooling method, there is another widely used cooling method in which a heat sink or fin or the like is connected to the parts to be cooled. In the cooling method, the heat of the parts to be cooled is dissipated through the heat sink. In addition, there is a cooling system in which a heat pipe is installed between the parts to be cooled and the heat sink or fin to improve effectiveness of the heat dissipation. Furthermore, there is developed a technique to attain further improved cooling efficiency in which air is blown to the heat sink, fin or the like by an electrically driven fan.

Heat pipe includes a container having a hermetically sealed hollow portion, i.e., cavity therein. The heat pipe has a function in which a heat is transferred from a heat absorbing portion to a heat dissipating portion, which is apart each other, by means of phase transition and movement of a working liquid accommodated within the hollow portion.

There is a round pipe type heat pipe which is widely used. Recently, a plate type heat pipe comes to attract attention. The plate type heat pipe may be called as a flat type heat pipe, a flat plate type heat pipe or the like. The plate type heat pipe has such a superior feature that the parts to be cooled can be effectively cooled, since the parts to be cooled can be contacted with the container in wide area depending on the shape of the container.

As described above, the plate type heat pipe has the superior feature in which the parts to be cooled is contacted in wide area with the heat absorbing surface of the container. In order to secure the flows of the working liquid from the heat dissipating portion to the heat absorbing portion, i.e., flowing back of the working liquid in the plate type heat pipe having the above-mentioned feature, it is preferable to use the heat pipe in so-called bottom heat mode (namely, the mode in which the heat pipe is used with the heat absorbing portion positioned below the heat dissipating portion).

Accordingly, the heat pipe is preferably installed in such manner that the plate type heat pipe is placed with the heat absorbing surface faced downward, and then, the parts to be cooled is contacted with the heat absorbing surface of thus placed heat pipe, and then, the heat sink is provided on the heat dissipating surface which is positioned upper side of the heat pipe. The above-mentioned installation of the heat pipe in relation to the parts to be cooled is the most ideal installation. According to the above installation, the lower side of the plate type heat pipe becomes the heat absorbing surface, and the upper side of the plate type heat pipe on which the heat sink is provided becomes the heat dissipating surface, thus the plate type heat pipe of the so-called bottom heat mode is obtained.

However, the size of the computer or the like becomes remarkably smaller. Together with the downsizing of the computer or the like, the electric or electronic devices mounting the parts to be cooled is installed not only in a fixed manner (for example, is placed on the desk), but also in a mobile manner (for example, is carried by human being). More specifically, the portable type of electric or electronic apparatus is widely used. In particular, it is considered that the small sized computer is to be used under the condition in which the heat pipe is kept inclined. In view of the above situation, it is expected to be provided the plate type heat pipe excellent in cooling efficiency even in case that the heat absorbing surface is positioned above the heat dissipating surface, i.e., the relative vertical position of the heat absorbing surface to the heat dissipating surface is reversed (which is called as the so-called "top heat mode").

The object of the present invention is therefore to provide plate type heat pipe excellent in cooling efficiency even in case of the so-called top heat mode, the method of manufacturing same and a cooling apparatus using the plate type heat pipe.

SUMMARY OF THE INVENTION

The present invention was made in view of the above-mentioned situation in the process of developing a plate type heat pipe excellent in cooling efficiency even in case of the so-called top heat mode.

The first embodiment of the plate type heat pipe of the present invention comprises:

a plate type container, said container including a heat absorbing side and a heat dissipating side to form a hermetically sealed hollow portion;

at least one heat transfer block, said block being thermally connected to each of inner walls of said heat absorbing side and said heat dissipating side;

a wick, said wick being placed along a side wall of said heat transfer block through said inner wall of said heat dissipating side; and a working fluid enclosed in said hollow portion.

The second embodiment of the plate type heat pipe of the invention further comprises a securing member to secure said wick and said heat transfer block in close contact.

In the third embodiment of the plate type heat pipe of the invention, said securing member comprises a metal having elasticity.

In the fourth embodiment of the plate type heat pipe of the invention, at least one protruding portion is formed on said heat absorbing side of said container.

In the fifth embodiment of the plate type heat pipe of the invention, said protruding portion is disposed in corresponding to a size and height of a part to be cooled.

In the sixth embodiment of the plate type heat pipe of the invention, at least one of said heat transfer block is joined to said protruding portion.

In the seventh embodiment of the plate type heat pipe of the invention, said heat transfer block and a securing member to secure said wick and said heat transfer block in close contact are placed in at least one of said protruding portion.

In the eighth embodiment of the plate type heat pipe of the invention, said heat transfer block and a securing member to secure said wick and said heat transfer block in close contact are placed in at least one of said protruding portion, and said heat transfer block is placed in at least one of remaining protruding portions and joined thereto.

In the ninth embodiment of the plate type heat pipe of the invention, said wick is secured in close contact between an inner wall of said protruding portion and a side wall of said heat transfer block.

In the tenth embodiment of the plate type heat pipe of the invention, said wick is placed along an inner wall of said heat dissipating side through a side wall of said heat transfer block to extend to an inner wall of said heat absorbing side, a tip portion of said wick being in contact with said inner wall of said heat absorbing side.

In the eleventh embodiment of the plate type heat pipe of the invention, said tip portion of said wick is metal-bonded to said inner wall of said heat absorbing side.

In the twelfth embodiment of the plate type heat pipe of the invention, said protruding portion comprises a protruding portion having different height, and said height of said protruding portion corresponds to a height of a part to be cooled attached to said protruding portion.

The first embodiment of the cooling apparatus comprises the plate type heat pipe as recited in any one of the first to third embodiments arranged to face a printed wiring board on which at least one of parts to be cooled is mounted, and said heat absorbing side is thermally connected to said parts to be cooled.

The second embodiment of the cooling apparatus comprising the plate type heat pipe including said protruding portion as recited in any one of fourth to twelfth embodiments arranged to face a printed wiring board on which parts to be cooled corresponding to said protruding portion in both number and height are mounted, and said protruding portion are thermally connected to said parts to be cooled.

The first embodiment of the method of manufacturing a plate type heat pipe of the invention comprises steps of:

preparing a container including a hollow portion by a plate member as a heat dissipating side and a worked plate member as a heat absorbing side including at least one protruding portion;

preparing a heat transfer block having a prescribed size and a netlike wick having a prescribed size;

arranging a securing member and said heat transfer block in at least one protruding portion within said hollow portion of said container;

placing said netlike wick along from a side wall of said heat transfer block through an inner wall of said heat dissipating side;

arranging said netlike wick so as for a tip of said netlike wick to be pinched between said side wall of said heat transfer block and said inner side wall of said protruding portion;

securing an upper surface and a lower surface of said heat transfer block in close contact to said inner wall of said heat dissipating side and said inner wall of said heat absorbing side, respectively, while said heat transfer block is pushed against said inner side wall of said protruding portion by said securing member to secure said netlike wick and said heat transfer block in close contact;

reducing a pressure within said hollow portion and enclosing a prescribed amount of working fluid. In the second embodiment of the method of the invention, said heat transfer block is pushed against said inner side wall of said protruding portion by said securing member to secure said netlike wick and said heat transfer block in close contact, and then an upper surface and a lower surface of said heat transfer block is metal-bonded to said inner wall of said heat dissipating side and said inner wall of said heat absorbing side, respectively.

In the third embodiment of the method of the invention, said securing member comprises a metal having elasticity.

In the fourth embodiment of the method of the invention, said protruding portion is disposed in corresponding to a size and height of part to be cooled.

In the fifth embodiment of the method of the invention, a tip portion of said wick is arranged so as to be in contact with said inner wall of said heat absorbing side.

In the sixth embodiment of the method of the invention, said tip portion of said wick is metal-bonded to said inner wall of said heat absorbing side.

DETAILED DESCRIPTION OF ILLUSTRATIVE EMBODIMENTS

The plate type heat pipe of the invention comprises a plate type container which includes a heat absorbing side and a heat dissipating side to form a hermetically sealed hollow portion, at least one heat transfer block which is thermally connected to each of the inner walls of the heat absorbing side and the heat dissipating side, a wick which is placed along a side wall of the heat transfer block through the inner wall of the heat dissipating side, and a working fluid enclosed in the hollow portion.

Furthermore, in the plate type heat pipe of the invention, at least one protruding portion may be formed on the heat absorbing side of the container.

In addition, in the plate type heat pipe of the invention, the wick preferably may be secured in close contact between an inner side wall of the protruding portion and a side wall of the heat transfer block.

Figure 1:
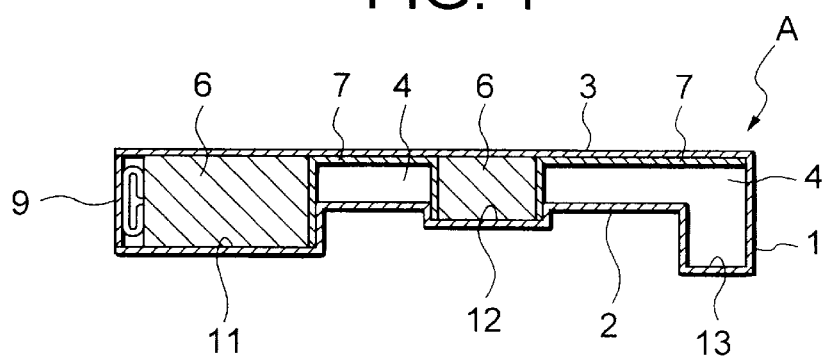
FIG. 1 is a schematic side sectional view of one embodiment of the plate type heat pipe of the invention.

FIG. 1 is a schematic side sectional view of one embodiment of the plate type heat pipe of the invention. In FIG. 1, the reference numeral 1 designates a container having a hermetically sealed hollow portion (i.e., cavity), which constitutes a plate type heat pipe A. The container 1 includes a heat absorbing side 2 and a heat dissipating side 3 to form the hollow portion. The container is formed by such material having an excellent thermal conductivity as copper or aluminum material.

As the copper material used to form the container 1, copper alloy materials such as those prescribed in JIS (Japanese Industrial Standard) C1020, C1100 or the like are preferable. As the aluminum material, aluminum alloy materials such as those prescribed in JIS A1100, A3000 series, A5000 series, A6000 series or the like are preferable.

The heat transfer block designated by the reference numeral 6 is arranged in such manner within the hollow portion 4 of the container 1 that the upper surface of the heat transfer block is in close contact with the inner wall of the heat dissipating side 3 of the container 1, and the lower surface of the heat transfer block is in close contact with the inner wall of the heat absorbing side 2 of the container 1. The heat transfer block 6 is provided to function in such manner that the heat transfer block receives the heat generated by the parts to be cooled through the heat absorbing side 2, and effectively conducts the heat to the heat dissipating side 3 (in other words, the heat transfer block rapidly diffuses a high density of heat generated by the parts to be cooled through the heat transfer block itself to prevent the so-called drying out of the working fluid). Accordingly, when the lower and upper surfaces of the heat transferring column are joined (for example, metal-bonded) to the heat absorbing side 2 and the heat dissipating side 3, respectively, the thermal resistance in the joint portions between the lower surface of the heat transfer block and the heat absorbing side as wall as between the upper surface of the heat transfer block and the heat dissipating side becomes more smaller, thus improving heat dissipating effect of the heat pipe. The heat transfer block comprises such material having an excellent thermal conductivity as described in relation to the material of the container, and has a polygonal or circular sectional area.

In addition, in the plate type heat pipe of the invention, the wick is placed along the inner wall of the heat dissipating side through a side wall of the heat transfer block to extend to the inner wall of the heat absorbing side, and the tip portion of the wick is in contact with the inner wall of the heat absorbing side.

More specifically, the wick designated by the reference numeral 7 is placed in contact along the inner wall of the heat dissipating side 3 of the container 1, and then is extended in contact along the side wall of the heat transfer block 6 to the inner wall of the heat absorbing side of the container 1. The tip portion of the wick is arranged so as to be in contact with the inner wall of the absorbing side of the container.

As shown in FIG. 1, in the protruding portion 13, the wick 7 is placed in contact along the inner wall of the heat dissipating side 3 to extend to the side wall of the container. In the protruding portion 12 in which the heat transfer block is arranged, the wicks 7 extending in contact along the inner wall of the heat dissipating side 3 further extend downward in contact along the side walls of the heat transfer block to the inner wall of the heat absorbing side 2 in the protruding portion 12.

The wick can be thermally connected with small thermal resistance between the wick 7 and the inner wall, as well as the wick and the side wall when the wick is arranged as described above. Furthermore, the tip portion of the wick 7 may be metal-bonded (for example, by silver soldering, soldering, welding or the like) to the inner wall of the heat absorbing side 2. When metal-bonded as described above, the thermal resistance between the wick 7 and the inner wall or the side wall can be further made small.

The wick is formed for example by piling a plurality of pieces of rectangle netlike wick comprising copper wire having a diameter of about 100 micron meter.

A prescribed amount of working fluid is received within the hollow portion 4 of the container 1 (not shown in figures). Water, substituted fleon, perfluorocarbon, ammonia, alcohol, acetone or the like may be used as the working fluid. The working fluid should be selected considering compatibility with the material of the container.

Figure 2:
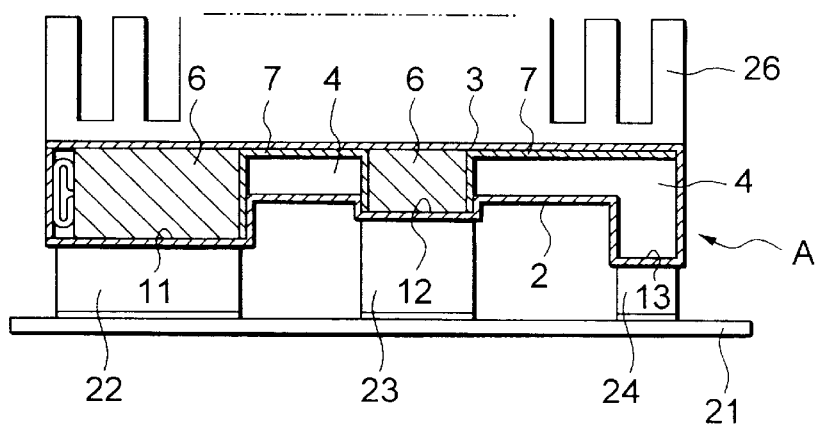
FIG. 2 is a schematic side sectional view of one embodiment of the cooling apparatus using the plate type heat pipe of the invention.
Figure 4:
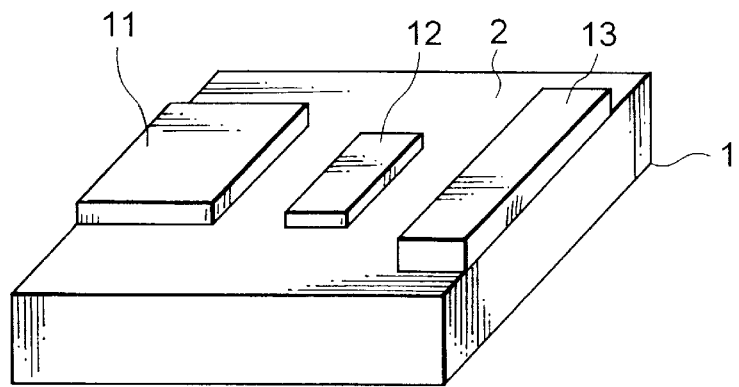
FIG. 4 is a schematic back side view of one embodiment of the plate type heat pipe of the invention.

The protruding portions arranged on the heat absorbing side 2 which are designated by the reference numerals 11, 12, 13 preferably have the respective sizes and heights (i.e., depths) corresponding to those of the parts to be cooled, as described later. FIG. 4 shows a schematic back side view of one example of the plate type heat pipe of the invention. As shown in FIGS. 2 and 4, the protruding portions 11, 12 and 13 have the respective sizes corresponding to the sizes of the parts to be cooled 22, 23 and 24, and the respective heights corresponding to the heights from the printed wiring board 21.

Furthermore, the plate type heat pipe of the invention includes a securing member to secure the wick and the heat transfer block in close contact.

The securing member designated by the reference numeral 9 has a function to improve the contact condition between the heat transfer block 6 and the wick 7 which are placed in the protruding portion 11 arranged on the heat absorbing side of the container. The securing member comprises metal or the like having elasticity. The heat transfer block is pushed against the wick 7 by the elasticity of the securing member to pinch the wick between the inner side wall of the protruding portion 11 and the side wall of the heat transfer block, thus holding the heat transfer block 6 and the wick 7 in good close contact. When the heat transfer block 6 and the wick 7 are secured in close contact as described above, the heat generated by the parts to be cooled can be effectively transferred to the heat dissipating side even in the so-called top heat mode by means of the combined effect of the thermal conductivity of the heat transfer block and the flowing back of the working fluid by the function of the wick.

The shape of the securing member may be a ring with a part thereof removed, a coil, a flat spring or the like.

In addition, in the plate type beat pipe of the invention, the heat transfer block and a securing member to secure the wick and the heat transfer block in close contact are placed in at least one of the protruding portion, and the heat transfer block is placed in at least one of the remaining protruding portions with the lower surface of the heat transfer block metal-bonded to the inner wall of the protruding portion (with the upper surface of the heat transfer block metal-bonded to the inner wall of the heat dissipating side).

More specifically, the reference numerals 11, 12, 13 in FIG. 1 respectively designate the protruding portions arranged on the heat absorbing side 2. The protruding portion 11 is formed in size in such manner that the securing member, the heat transfer block and the wick can be accommodated therein, as described above. The protruding portion 12 is formed in size in such manner that the heat transfer block 6 and the wick 7 can be provided. More specifically, the heat transfer block 6 and the wick 7 disposed on the side wall of the heat transfer block 6 can be accommodated within the protruding portion (although two side walls of the square column shaped heat transfer block are shown in FIG. 1, the wick can be disposed on all the four side walls of the heat transfer block). In case that the amount of generated heat of the parts to be cooled is not so large, the heat transfer is effectively implemented without disposing the securing member. Accordingly, the securing member may not be disposed in corresponding to the amount of the generated heat of the parts to be cooled.

The heat transfer block 6 is not disposed in the protruding portion 13. In case that the amount of the generated heat of the parts to be cooled is very small, the cooling efficiency can be effectively attained by the general function of the heat pipe without disposing the heat transfer block 6 in the protruding portion.

In the cooling apparatus of the present invention to cool the parts to be cooled, the plate type heat pipe of the invention is arranged in a fashion to face a printed wiring board on which at least one of parts to be cooled is mounted, and the heat absorbing side of the heat pipe is thermally connected to the parts to be cooled.

In the cooling apparatus of the present invention to cool the parts to be cooled, the plate type heat pipe with the protruding portions disposed is arranged in a fashion to face a printed wiring board on which parts to be cooled respectively corresponding to the protruding portions in both number and height are mounted, and each of the protruding portions is thermally connected to the parts to be cooled, respectively.

FIG. 2 is a schematic side sectional view of one embodiment of the cooling apparatus using the plate type heat pipe of the invention in which the heat pipe A is practically installed so as to cool the parts to be cooled incorporated on the printed wiring board. In FIG. 2, the reference numeral 21 designates the printed wiring board on which different sizes of the parts to be cooled 22, 23, 24 such as semiconductor chips are incorporated. It is exemplified that the part 22 generates a large amount of heat, the part 23 generates a medium amount of heat, and the part 24 generates a small amount of heat (In FIG. 2, each one of the above kinds of parts to be cooled is shown respectively).

There are arranged the protruding portions 11, 12, 13 on the heat absorbing side 2 of the plate type heat pipe, each of which has the corresponding size and height to the parts to be cooled. In accordance with the amount of generated heat of the parts to be cooled, the heat transfer block 6, the wick 7 and the securing member 9 are accommodated in the protruding portion 11, the heat transfer block 6 and the wick 7 are accommodated in the protruding portion 12, and the protruding portion 13 is as the hollow portion per se (i.e., none of the heat transfer block 6, the wick 7 and the securing member 9 are accommodated therein). The reference numeral 26 shows a heat dissipating fin.

When the plate type heat pipe A is arranged in a fashion to cool the parts to be cooled 22, 23, 24 incorporated on the printed wiring board 21, and the parts to be cooled are operated, the parts to be cooled 22, 23, 24 generate heat resulting in the rise of the temperature thereof.

The heat generated by the part to be cooled 22 which generates the largest amount of heat is transferred through the corresponding part of the heat absorbing side 2, on which the part to be cooled 22 contacts, to the heat transfer block 6. The heat thus transferred to the heat transfer block 6 is further transferred directly to the heat dissipating side 3 of the plate type heat pipe A while the working fluid existing on the heat absorbing side 2 evaporates by the function of the heat pipe operation to transfer the heat to the heat dissipating side 3 of the plate type heat pipe A. The heat thus transferred to the heat dissipating side 3 is transferred to the heat dissipating fin 26 to be discharged outward into the air, resulting in cooling of the part 22 to be cooled.

Since there is arranged in the protruding portion 11, on which the part to be cooled 22 generating the largest amount of heat contacts, the securing member 9 to push the heat transfer block 6 to the wick 7 in a fashion to secure the wick 7 between the heat transfer block 6 and the inner side wall of the protruding portion 11, the wick 7 is secured in close contact to the side wall of the heat transfer block 6 to enlarge the evaporating area for the working fluid. As a result, the heat transfer rate is further improved to dissipate much larger amount of the heat.

When the plate type heat pipe of the invention is used in the so-called bottom heat mode, as shown in FIG. 2, the working fluid which is phase-transited back to a liquid phase in the plate type heat pipe flows back smoothly by the gravity and the capillary action of the wick 7.

The plate type heat pipe is sometimes kept inclined to come into the condition of the so-called top heat mode, depending on the situation in which the heat pipe is used. Even in such a situation, the working fluid flows back smoothly by the capillary action of the wick 7 to effectively cool the parts to be cooled. In particular, since the tip portion of the wick 7 contacts (preferably, is joined to) the inner wall of the heat absorbing side on which the part to be cooled 22 is attached, the flowing back of the working fluid is more surely maintained.

The heat generated by the part to be cooled 23 which generates the medium amount of heat is transferred through the corresponding part of the heat absorbing side 2, on which the part to be cooled 23 contacts, to the heat transfer block 6. The heat thus transferred to the heat transfer block 6 is further transferred directly to the heat dissipating side 3 of the plate type heat pipe A, while the working fluid existing on the heat absorbing side 2 evaporates by the function of the heat pipe operation to transfer the heat to the heat dissipating side 3 of the plate type heat pipe A. The heat thus transferred to the heat dissipating side 3 is transferred to the heat dissipating fin 26 to be discharged outward into the air, resulting in cooling of the part 23 to be cooled.

There are arranged the heat transfer block 6 and the wick 7 in the protruding portion 12 on which the part to be cooled 23 generating the medium amount of heat contacts. Since there is not arranged the securing member in the protruding portion 12, the wick 7 is not so firmly secured as the case described above, however, the heat generated by the part to be cooled generating medium amount of heat can be fully transferred to be dissipated through the heat dissipating fin, accordingly, suitable to cool the part to be cooled generating medium amount of heat.

When the plate type heat pipe A of the invention is used in the so-called bottom heat mode, as shown in FIG. 2, the working fluid which is phase-transited back to a liquid phase in the plate type heat pipe flows back smoothly by the gravity and the capillary action of the wick 7.

The plate type heat pipe is sometimes kept inclined to come into the condition of the so-called top heat mode, depending on the situation in which the heat pipe is used. Even used in the so-called top heat mode, the working fluid flows back smoothly by the capillary action of the wick 7 to effectively cool the parts to be cooled.

The heat generated by the part to be cooled 24 which generates the small amount of heat is transferred to the corresponding part of the heat absorbing side 2 on which the part to be cooled 24 contacts. The heat thus transferred to the heat absorbing side 2 is transferred to the heat dissipating side 3 of the plate type heat pipe A by the function of the heat pipe operation. The heat thus transferred to the heat dissipating side 3 is transferred to the heat dissipating fin 26 to be discharged outward into the air, resulting in cooling of the part 24 to be cooled. Even used in the so-called top heat mode, the heat is transferred through the container of the plate type heat pipe to sufficiently cool the part to be cooled 24 generating small amount of heat.

Figure 3:
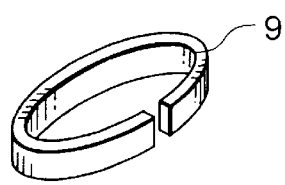
FIG. 3 is a schematic perspective view of one embodiment of the securing member of the invention.

FIG. 3 is a schematic perspective view of one embodiment of the securing member 9 of the invention. The securing member as shown in FIG. 3 is formed by bending the spring type metal material having high elasticity to enhance resiliency. When the above-mentioned securing member is arranged between the inner side of the container and the heat transfer block 6, as shown in FIG. 2, the heat transfer block 6 is pushed toward the wick 7 to secure the heat transfer block column 6 and the wick in close contact.

The method of manufacturing the plate type heat pipe of the invention is described below.

The plate type heat pipe of the invention is manufactured by the following steps: preparing a container including a hollow portion by a plate member as a heat dissipating side and a worked plate member as a heat absorbing side including at least one protruding portion; preparing a heat transfer block and a netlike wick; arranging a securing member and the heat transfer block in at least one protruding portion within the hollow portion of thus prepared container; placing the netlike wick along from a side wall of the heat transfer block through an inner wall of the heat dissipating side; arranging the netlike wick so as for a tip of the netlike wick to be pinched between the side wall of the heat transfer block and the inner wall of the protruding portion; securing an upper surface and a lower surface of the heat transfer block in close contact to the inner wall of the heat dissipating side and the inner wall of the heat absorbing side, respectively, while the heat transfer block is pushed against the inner wall of the protruding portion by the securing member to secure in close contact the netlike wick and the heat transfer block; reducing a pressure within the hollow portion and enclosing a prescribed amount of working fluid.

In the method of manufacturing the plate type heat pipe of the invention, the arrangement of the heat transfer block, the netlike wick, and/or the securing member is performed in accordance with the arrangement of the parts to be cooled.

When there are provided three protruding portions for example, the heat transfer block, the netlike wick, and the securing member are arranged in one protruding portion, the heat transfer block and the netlike wick are arranged in one other protruding portion, and none of the heat transfer block, the netlike wick and the securing member is arranged in the remaining protruding portion.

In addition, in the method of manufacturing the plate type heat pipe of the invention, the heat transfer block is pushed against the inner side wall of the protruding portion by the securing member to secure in close contact the netlike wick and the heat transfer block, and then the upper surface and the lower surface of the heat transfer block are metal-bonded to the inner wall of the heat dissipating side and the inner wall of the heat absorbing side, respectively.

EXAMPLE

The plate type heat pipe of the invention is described in detail by the example.

The container of the plate type heat pipe as shown in FIG. 2 was prepared by the use of the flat plate of OFC (Oxygen-Free Copper) material of 100 mm in length, 70 mm in width and 1.0 mm in thickness, and the press-formed plate of OFC material having three protrusions different in height of 100 mm in length, 70 mm in width and 0.5 mm in thickness. The thickness of thus prepared container of the plate type heat pipe of the invention was 6 mm. The respective thickness of the three protruding portions 11, 12, 13 was 2.0 mm, 1.5 mm and 3.0 mm. Furthermore, the area of the protruding portion 11 to which the part to be cooled of the largest amount of generating heat is attached was 25.4 mm in length and 25.4 mm in width.

The rectangle netlike wick comprising copper wire material of 100 micron meter in diameter is arranged as shown in FIG. 2. More specifically, as shown in FIG. 2, the wick is arranged in the portion of the container between the protruding portion 11 and the protruding portion 12 in such manner that one end portion of the wick is secured between the heat transfer block 6 in the protruding portion 12 and the inner side wall of the protruding portion 12, then the wick extends along the side wall of the heat transfer block 6 in the protruding portion 12 and then along the inner wall of the heat dissipating side 3, and then further along the side wall of the heat transfer block 6 in the protruding portion 11, and the other end portion of the wick is secured between the inner side wall of the protruding portion 11 and the heat transfer block 6 in the protruding portion 11. The tip portions of the respective end portions contacted the inner wall of the heat absorbing side 2. The securing member 9 of the OFC material as shown in FIG. 3 was arranged between the opposite side wall of the heat transfer block 6 in the protruding portion 11 and the inner side wall of the container 1.

In addition, the wick is arranged in the remaining portion of the container in such manner that one end of the wick is secured between the heat transfer block 6 in the protruding portion 12 and the inner side wall of the protruding portion 12, then the wick extends in contact along the side wall of the heat transfer block 6 in the protruding portion 12 and then in contact along the inner wall of the heat dissipating side 3 to the side wall of the container 1.

The semiconductor chips 22, 23, 24 having the amount of generated heat of 150, 20, 10 W(watt) respectively were attached and joined respectively to the protruding portions 11, 12, 13 of thus prepared plate type heat pipe as shown in FIG. 2, and the semiconductor chips 22, 23, 24 were cooled. The heat dissipating fin was joined on the outer surface of the heat dissipating side. As a result, the temperature of the respective semiconductor chips 22, 23, 24 was maintained up to 90 degree centigrade, thus the effective heat dissipation was implemented.

Furthermore, the thermal resistance was investigated in the protruding portion 11 in which the securing member 9 was arranged in such manner as described above. For comparison, the thermal resistance was investigated in the protruding portion 11 in which the securing member 9 was not arranged. As a result, the thermal resistance in the protruding portion 11 with the securing member was 0.045 K/W while the thermal resistance in the protruding portion 11 without the securing member was 0.090 K/W which was almost double of the thermal resistance in the protruding portion 11 with the securing member. As is clear from the above, the thermal efficiency can be remarkably improved by securing the heat transfer block and the wick in close contact with the use of the securing member 9.

As is clear from the foregoing, according to the plate type heat pipe of the invention, by combining the heat transfer block and the wick in such manner as described above, the function of the plate type heat pipe excellent in cooling efficiency may be maintained even in case of the so-called top heat mode. In addition, the thermal efficiency can be remarkably improved by means of the securing member arranged in such manner as described above. Accordingly, the plate type heat pipe of the invention is applied in the electric or electronic devices mounting the parts to be cooled such as semiconductor chip, the parts to be cooled can be effectively cooled, and furthermore, the heat pipe may maintain excellent cooling efficiency even in case that the devices are used inclined (i.e., in the top heat mode).

What is claimed is:

1. A plate type heat pipe comprising:
    a plate type container, said container including a heat absorbing side and a heat dissipating side to form a hermetically sealed hollow portion;
    at least one heat transfer block, said block being thermally connected to each of inner walls of said heat absorbing side and said heat dissipating side;
    a wick, said wick being placed along a side wall of said heat transfer block through said inner wall of said heat dissipating side; and
    a working fluid enclosed in said hollow portion.

2. The plate type heat pipe as claimed in claim 1, further comprising a securing member to secure said wick and said heat transfer block in close contact.

3. The plate type heat pipe as claimed in claim 2, wherein said securing member comprises a metal having elasticity.

4. The plate type heat pipe as claimed in claim 1, wherein at least one protruding portion is formed on said heat absorbing side of said container.

5. The plate type heat pipe as claimed in claim 4, wherein said protruding portion is disposed in corresponding to a size and height of a part to be cooled.

6. The plate type heat pipe as claimed in claim 4, wherein at least one of said heat transfer block is joined to said protruding portion.

7. The plate type heat pipe as claimed in claim 4, wherein said heat transfer block and a securing member to secure said wick and said heat transfer block in close contact are placed in at least one of said protruding portion.

8. The plate type heat pipe as claimed in claim 4, wherein said heat transfer block and a securing member to secure said wick and said heat transfer block in close contact are placed in at least one of said protruding portion, and said heat transfer block is placed in at least one of remaining protruding portions and joined thereto.

9. The plate type heat pipe as claimed in claim 4, wherein said wick is secured in close contact between an inner wall of said protruding portion and a side wall of said heat transfer block.

10. The plate type heat pipe as claimed in claim 1, wherein said wick is placed along an inner wall of said heat dissipating side through a side wall of said heat transfer block to extend to an inner wall of said heat absorbing side, a tip portion of said wick being in contact with said inner wall of said heat absorbing side.

11. The plate type heat pipe as claimed in claim 10, wherein said tip portion of said wick is metal-bonded to said inner wall of said heat absorbing side.

12. The plate type heat pipe as claimed in claim 4, wherein said protruding portion comprises a protruding portion having different height, said height of said protruding portion corresponds to a height of a part to be cooled attached to said protruding portion.

13. A cooling apparatus comprising;
    a plate type heat pipe including:
        a plate type container, said container including a heat absorbing side and a heat dissipating side to form a hermetically sealed hollow portion;
        at least one heat transfer block, said block being thermally connected to each of inner walls of said heat absorbing side and said heat dissipating side;
        a wick, said wick being placed along a side wall of said heat transfer block through said inner wall of said heat dissipating side;
        a working fluid enclosed in said hollow portion; and
    wherein the plate type heat pipe is arranged to face a printed wiring board on which at least one of parts to be cooled is mounted, said heat absorbing side is thermally connected to said parts to be cooled.

14. A cooling apparatus comprising;
    a plate type heat pipe including:
        a plate type container, said container including a heat absorbing side and a heat dissipating side to form a hermetically sealed hollow portion at least one protruding portion is formed on said heat absorbing side of said container;
        at least one heat transfer block, said block being thermally connected to each of inner walls of said heat absorbing side and said heat dissipating side;
        a wick, said wick being placed along a side wall of said heat transfer block through said inner wall of said heat dissipating side;
        a working fluid enclosed in said hollow portion; and
    wherein the at least one protruding portion is arranged to face a printed wiring board on which parts to be cooled corresponding to said at least one protruding portion in both number and height are mounted, said protruding portion being thermally connected to said parts to be cooled.

15. A cooling apparatus comprising:
    a plate type heat pipe comprising:
        a plate type container, said container including a heat absorbing side and a heat dissipating side to form a hermetically sealed hollow portion;
        at least one heat transfer block, said block being thermally connected to each of inner walls of said heat absorbing side and said heat dissipating side;
        at least one protruding portion formed on said heat absorbing side of said container, at least one protruding portion having a different height, said height of said protruding portion corresponds to a height of a part to be cooled attached to said protruding portion, said protruding portion arranged to face a printed wiring board on which said parts to be cooled corresponding to said protruding portion in both numbers and height are mounted, said protruding position are thermally connected to said parts to be cooled;
        a wick, said wick being placed along a side wall of said heat transfer block through said inner wall of said heat dissipating side; and
        a working fluid enclosed in said hollow portion.

* * * * *

UNITED STATES PATENT AND TRADEMARK OFFICE
CERTIFICATE OF CORRECTION

PATENT NO.   : 6,256,201 B1
DATED        : July 3, 2001
INVENTOR(S)  : Ikeda et al.

It is certified that error appears in the above-identified patent and that said Letters Patent is hereby corrected as shown below:

Title page,
Item [73], delete "Furukawa" and insert therefor -- The Furukawa --.

Column 1,
Line 21, after "cooling" delete "techniques" and insert therefor -- technique --.

Column 5,
Line 31, after "as" (first occurrence) delete "wall" and insert therefor -- well --.

Signed and Sealed this

Twenty-second Day of July, 2003

JAMES E. ROGAN
*Director of the United States Patent and Trademark Office*